United States Patent
Aoki et al.

(10) Patent No.: US 12,114,550 B2
(45) Date of Patent: *Oct. 8, 2024

(54) DISPLAY DEVICE

(71) Applicant: Japan Display Inc., Tokyo (JP)

(72) Inventors: Hayata Aoki, Tokyo (JP); Hiroumi Kinjo, Tokyo (JP); Masumi Nishimura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/481,293

(22) Filed: Oct. 5, 2023

(65) Prior Publication Data

US 2024/0040872 A1 Feb. 1, 2024

Related U.S. Application Data

(63) Continuation of application No. 17/645,161, filed on Dec. 20, 2021, now Pat. No. 11,818,930.

(30) Foreign Application Priority Data

Dec. 25, 2020 (JP) .................................. 2020-217104

(51) Int. Cl.
| | |
|---|---|
| *H10K 59/131* | (2023.01) |
| *H10K 50/86* | (2023.01) |
| *H10K 59/122* | (2023.01) |
| *H10K 59/35* | (2023.01) |

(52) U.S. Cl.
CPC ......... *H10K 59/131* (2023.02); *H10K 59/353* (2023.02)

(58) Field of Classification Search
CPC .......................... H10K 50/82; H10K 2102/351
See application file for complete search history.

(56) References Cited

U.S. PATENT DOCUMENTS

| | | |
|---|---|---|
| 11,211,440 B2 | 12/2021 | Kasahara |
| 2004/0160170 A1 | 8/2004 | Sato et al. |
| 2009/0009069 A1 | 1/2009 | Takata |
| 2018/0062109 A1* | 3/2018 | Kim .................. H10K 59/8723 |
| 2021/0066652 A1 | 3/2021 | Lee et al. |
| 2021/0091158 A1 | 3/2021 | Kasahara |

(Continued)

FOREIGN PATENT DOCUMENTS

| | | |
|---|---|---|
| JP | 2000195677 A | 7/2000 |
| JP | 2004207217 A | 7/2004 |
| JP | 2008135325 A | 6/2008 |

(Continued)

*Primary Examiner* — Mohsen Ahmadi
(74) *Attorney, Agent, or Firm* — Maier & Maier, PLLC

(57) ABSTRACT

According to one embodiment, a display device includes a lower electrode arranged on a first insulating layer, a second insulating layer arranged on the first insulating layer, having an opening overlapping the lower electrode, and being in a lattice form, a feed line arranged on the second insulating layer, having a first line portion, a second line portion, and a third line portion being continuous with the first and second line portions and having a different width from the first and second line portions, an organic layer arranged in the opening and covering the lower electrode, and an upper electrode being in contact with the first, second and third line portions, and covering the organic layer.

5 Claims, 9 Drawing Sheets

(56) References Cited

U.S. PATENT DOCUMENTS

2022/0077246 A1* 3/2022 You .................. H10K 59/12
2022/0140041 A1 5/2022 Lee et al.

FOREIGN PATENT DOCUMENTS

| JP | 2009032673 A | 2/2009 |
| JP | 2010118191 A | 5/2010 |
| WO | 2019026511 A1 | 2/2019 |

* cited by examiner

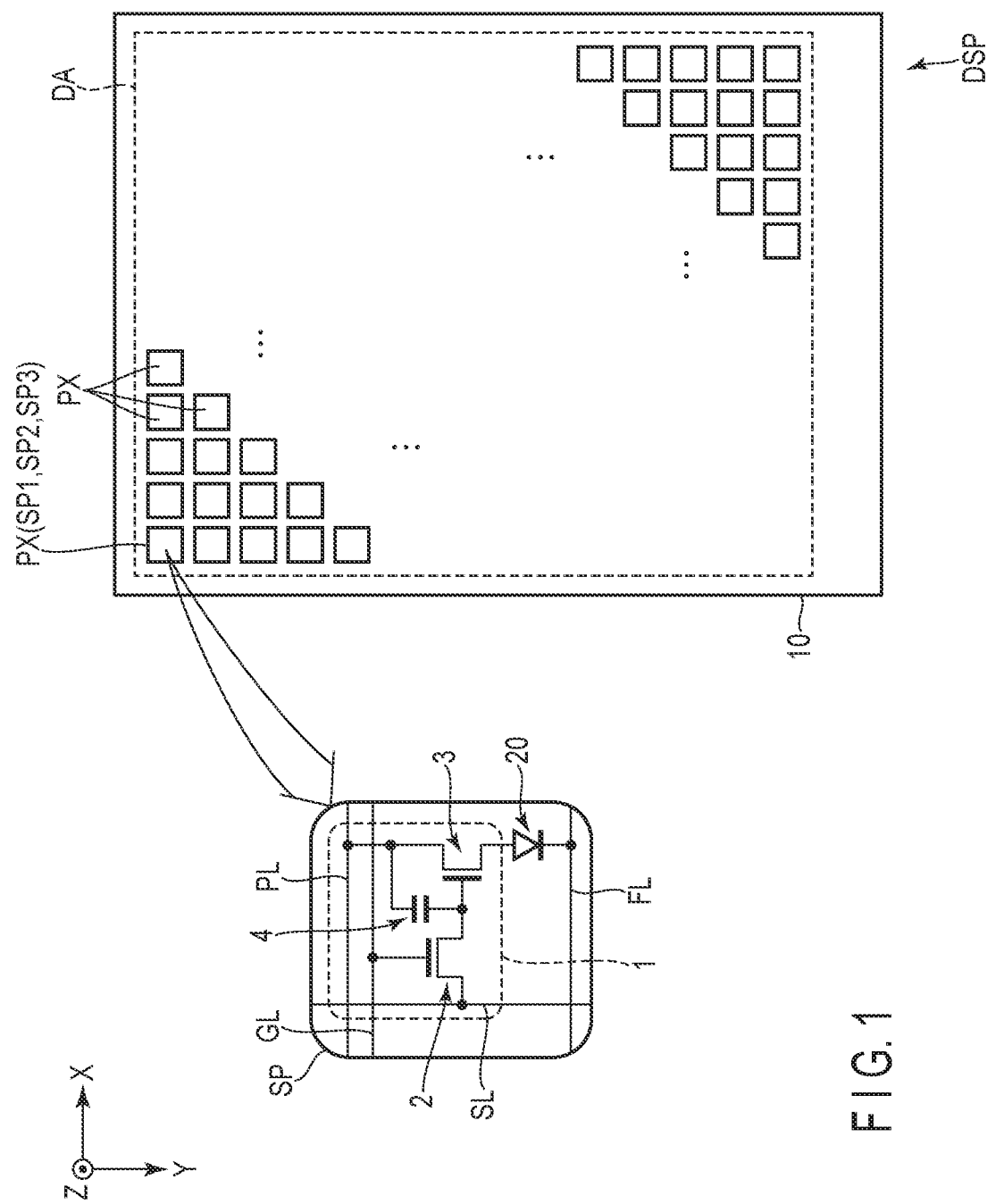
F I G. 1

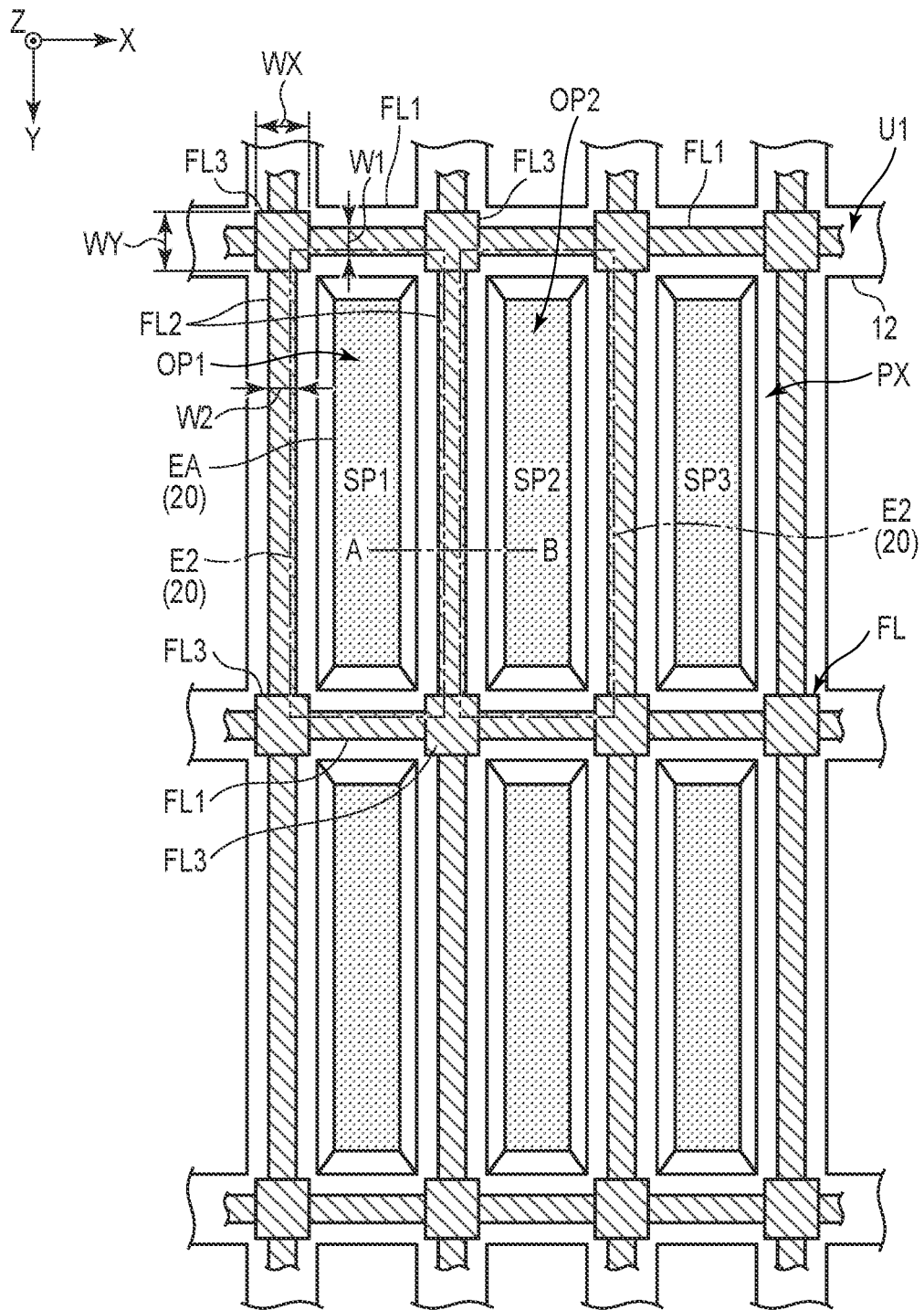
F I G. 2

DISPLAY DEVICE

CROSS-REFERENCE TO RELATED APPLICATIONS

This application is a continuation of U.S. application Ser. No. 17/645,161, filed Dec. 20, 2021, and is based upon and claims the benefit of priority from Japanese Patent Application No. 2020-217104, filed Dec. 25, 2020, the entire contents of each of which are incorporated herein by reference.

FIELD

Embodiments described herein relate generally to a display device.

BACKGROUND

Recently, a display device employing an organic light-emitting diode (OLED) as a display element has been put into practical use. The display element comprises an organic layer between a pixel electrode and a common electrode. The organic layer includes function layers such as a hole transport layer and an electron transport layer in addition to a light emitting layer. This organic layer is formed by, for example, a vacuum vapor deposition method.

For example, in the case of vapor deposition using mask, a fine mask having openings corresponding to respective pixels is applied. However, due to the accuracy of processing the fine mask, the deformation of the openings and the like, the accuracy of forming a thin film by vapor deposition may be reduced. Therefore, there is demand to form the organic layer having a desired shape without applying the fine mask.

In one example, such a technique is known that the organic layer and a cathode (second electrode) are divided using a pixel dividing structure. In this technique, in order to supply a predetermined potential to the divided cathodes, it is necessary to electrically connect the cathodes and feed lines reliably.

BRIEF DESCRIPTION OF THE DRAWINGS

FIG. 1 is an illustration showing a configuration example of a display device DSP according to a present embodiment.

FIG. 2 is a plan view showing an example of the pixel PX shown in FIG. 1.

DETAILED DESCRIPTION

Figure 3:
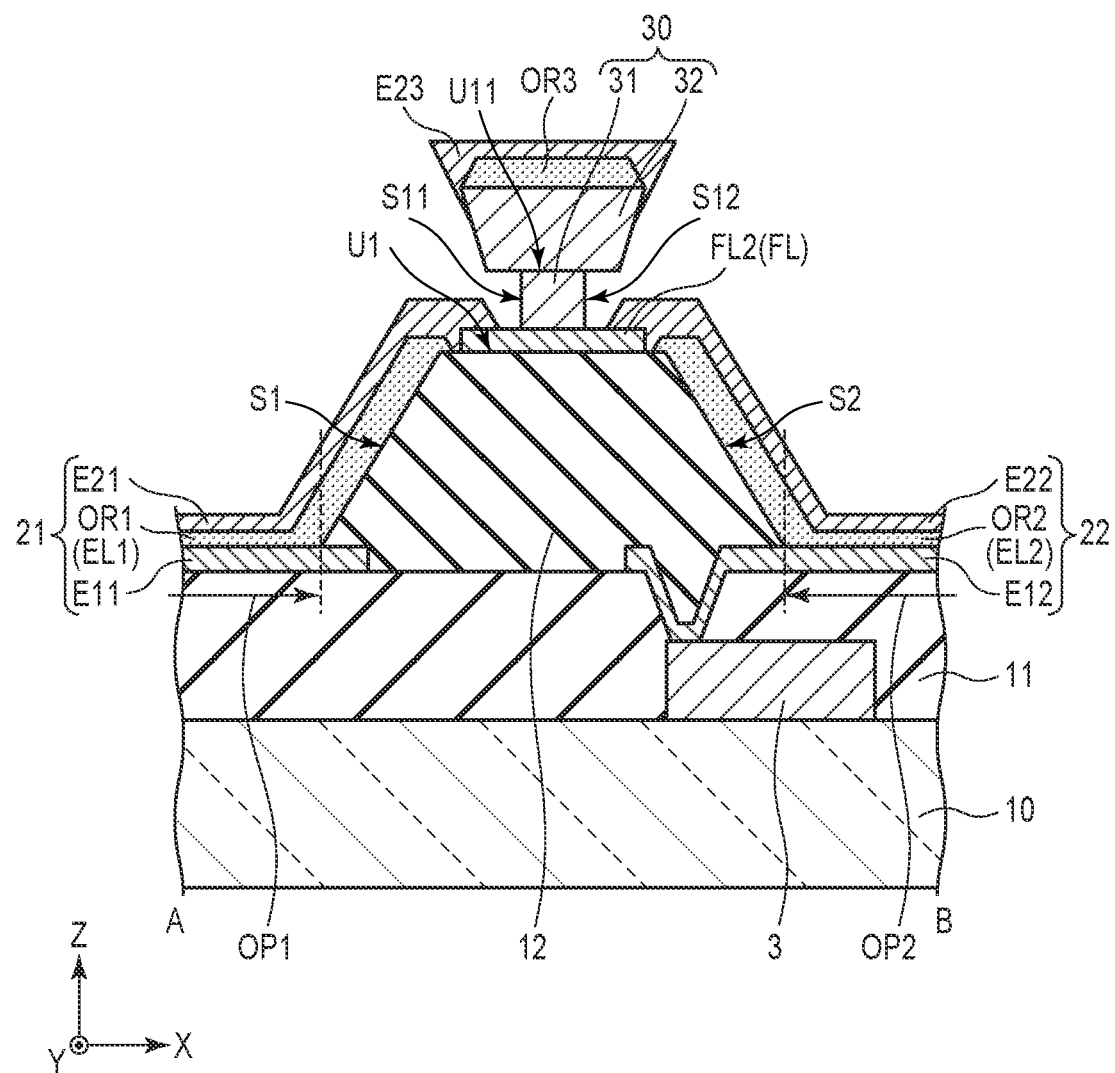
FIG. 3 is a cross-sectional view along line A-B shown in FIG. 2.

In general, according to one embodiment, there is provided a display device comprising: an insulating substrate; a first insulating layer arranged on the insulating substrate; a lower electrode arranged on the first insulating layer; a second insulating layer arranged on the first insulating layer, having an opening overlapping the lower electrode, and being in a form of a lattice; a feed line arranged on the second insulating layer, having a first line portion extending in a first direction, a second line portion extending in a second direction intersecting the first direction, and a third line portion being continuous with each of the first line portion and the second line portion and having a width different from a width of the first line portion and a width of the second line portion; an organic layer including a light emitting layer, arranged in the opening, and covering the lower electrode; and an upper electrode being in contact with each of the first line portion, the second line portion and the third line portion, and covering the organic layer.

The present embodiment will be described hereinafter with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, constituent elements which function in the same or a similar manner to those described in connection with preceding drawings are denoted by the same reference numbers, and detailed description thereof which is considered redundant is omitted unless necessary.

In the drawings, in order to make understanding easier, an X-axis, a Y-axis and a Z-axis which are orthogonal to each other are shown as needed. A direction along the X-axis is referred to as an X direction or a first direction, a direction along the Y-axis is referred to as a Y direction or a second direction, and a direction along the Z-axis is referred to as a Z direction or a third direction. A plane defined by the X-axis and the Y-axis is referred to as an X-Y plane, and a plane defined by the X-axis and the Z-axis is referred to as an X-Z plane. Viewing the X-Y plane is referred to as planar view.

A display device DSP according to the present embodiment is an organic electroluminescent display device comprising an organic light-emitting diode (OLED) as a display element, and is mounted on a television set, a personal computer, a mobile terminal, a mobile telephone and the like. The display element described below can be applied as a light emitting element of an illumination device, and the display device DSP can be diverted to another electronic device such as an illumination device.

FIG. 1 is an illustration showing a configuration example of a display device DSP according to the present embodiment. The display device DSP comprises a display portion DA where an image is displayed on an insulating base material 10. The base material 10 is an insulating substrate, and may be glass or flexible resin film.

The display portion DA comprises a plurality of pixels PX arranged in a matrix in the first direction X and the second direction Y. The pixel PX comprises a plurality of sub-pixels SP1, SP2 and SP3. In one example, the pixel PX comprises a red sub-pixel SP1, a green sub-pixel SP2 and a blue sub-pixel SP3. Note that the pixel PX may comprise four or more sub-pixels including a sub-pixel of another color such as white in addition to the sub-pixels of these three colors.

A configuration example of one sub-pixel SP included in the pixel PX will be briefly described.

That is, the sub-pixel SP comprises a pixel circuit 1 and a display element 20 which is drive controlled by the pixel circuit 1. The pixel circuit 1 comprises a pixel switch 2, a drive transistor 3 and a capacitor 4. The pixel switch 2 and the drive transistor 3 each are, for example, a switch element composed of a thin-film transistor.

Regarding the pixel switch 2, a gate electrode is connected to a scanning line GL, a source electrode is connected to a signal line SL, and a drain electrode is connected to one electrode constituting the capacitor 4 and a gate electrode of the drive transistor 3. Regarding the drive transistor 3, a source electrode is connected to the other electrode constituting the capacitor 4 and a power line PL, and a drain electrode is connected to an anode of the display element 20. A cathode of the display element 20 is connected to a feed line FL. Note that the configuration of the pixel circuit 1 is not limited to the illustrated example.

The display element 20 is an organic light-emitting diode (OLED) which is a light emitting element. For example, the sub-pixel SP1 comprises a display element which emits light corresponding to a red wavelength, the sub-pixel SP2 comprises a display element which emits light corresponding to a green wavelength, and the sub-pixel SP3 comprises a display element which emits light corresponding to a blue wavelength. The pixel PX comprises the sub-pixels SP1, SP2 and SP3 of different display colors so that multicolor display can be realized.

However, the display elements 20 of the sub-pixels SP1, SP2 and SP3 may be configured to emit the same color of light. Accordingly, monochrome display can be realized.

In addition, when the display elements 20 of the sub-pixels SP1, SP2 and SP3 are configured to emit white light, color filters opposed to the display elements 20 may be arranged. For example, the sub-pixel SP1 comprises a red color filter opposed to the display element 20, the sub-pixel SP2 comprises a green color filter opposed to the display element 20, and the sub-pixel SP3 comprises a blue color filter opposed to the display element 20. Accordingly, multicolor display can be realized.

Alternatively, when the display elements 20 of the sub-pixels SP1, SP2 and SP3 are configured to emit ultraviolet light, light conversion layers opposed to the display elements 20 may be arranged so that multicolor display can be realized.

The configuration of the display element 20 will be described later.

FIG. 2 is a plan view showing an example of the pixel PX shown in FIG. 1.

The sub-pixels SP1, SP2 and SP3 constituting one pixel PX each are substantially in the form of a rectangle extending in the second direction Y, and are arranged in the first direction X. The outer shape of each sub-pixel corresponds to the outer shape of a light emitting area EA in the display element 20, but the illustration is simplified and does not necessarily reflect the actual shape. Here, it is assumed that the light emitting area EA is in the form of a rectangle having short sides extending in the first direction X and long sides extending in the second direction Y.

An insulating layer 12 which will be described later is in the form of a lattice extending in the first direction X and the second direction Y in planar view, and surrounds each of the sub-pixels SP1, SP2 and SP3 or the display element 20 of each sub-pixel. This insulating layer 12 may be referred to as a rib, a partition, a bank or the like. The insulating layer 12 has a plurality of openings OP including openings OP1 and OP2. The light emitting area EA is formed in the opening OP of the insulating layer 12. The details of the light emitting area EA will be described later.

The feed lines FL are arranged on an upper surface U1 of the insulating layer 12. The feed lines FL have first line portions FL1, second line portions FL2 and third line portions FL3. The first line portions FL1, the second line portions FL2 and the third line portions FL3 are integrally or continuously formed.

The first line portions FL1 extend in the first direction X, and have a constant width W1 along the second direction Y. These first line portions FL1 are arranged on parts of the lattice-like upper surface U1 which extend along the first direction X. For one sub-pixel, one pair of first line portions FL1 are arranged to be opposed to each other across the light-emitting area EA.

The second line portions FL2 extend in the second direction Y and have a constant width W2 along the first direction X. These second line portions FL2 are arranged on parts of the lattice-like upper surface U1 which extend along the second direction Y. For one sub-pixel, one pair of second line portions FL2 are arranged to be opposed to each other across the light emitting area EA.

The third line portions FL3 are continuous with the first line portions FL1 and the second line portions FL2. These third line portions FL3 are arranged on intersecting parts of the lattice-like upper surface U1. For one sub-pixel, four third line portions FL3 are arranged to be opposed to four corners of the light emitting area EA.

In other words, the first line portion FL1 is arranged between two third line portions FL3 arranged with a space in the first direction X, and the second line portion FL2 is arranged between two third line portions FL3 arranged with a space in the second direction Y.

The third line portion FL3 has a width different from the width W1 of the first line portion FL1 and the width W2 of the second line portion FL2. In the example shown in FIG. 2, the third line portion FL3 is substantially in the form of a quadrangle having a width WX along the first direction X and a width WY along the second direction Y. The width WY is greater than the width W1 (WY>W1). The width WX is greater than the width W2 (WX>W2).

An upper electrode E2 of the display element 20 overlaps not only the light emitting area EA but also the insulating layer 12 between the light emitting area EA and the feed line FL as shown by a dashed dotted line. In addition, the upper electrode E2 is in contact with each of the first line portion FL1, the second line portion FL2 and the third line portion FL3. Accordingly, a predetermined potential is supplied from the feed line FL to the upper electrode E2.

FIG. 3 is a cross-sectional view along line A-B shown in FIG. 2.

Here, attention is focused on two display elements which are adjacent to each other in the first direction X. For the sake of convenience, a display element located on the left side of the drawing is described as a display element 21, and a display element located on the right side of the drawing is described as a display element 22.

The display element 21 comprises a lower electrode (first lower electrode) E11, an organic layer (first organic layer) OR1 and an upper electrode (first upper electrode) E21.

The display element 22 comprises a lower electrode (second lower electrode) E12, an organic layer (second organic layer) OR2 and an upper electrode (second upper electrode) E22.

The pixel circuit 1 shown in FIG. 1 is arranged on the base material 10, and is covered with an insulating layer 11. FIG. 3 simply shows the drive transistor 3 included in the pixel circuit 1. The insulating layer (first insulating layer) 11 corresponds to the underlayer of the display elements 21 and 22. The insulating layer (second insulating layer) 12 is arranged on the insulating layer 11. The insulating layers 11 and 12 each are, for example, an organic insulating layer.

The lower electrodes E11 and E12 are arranged on the insulating layer 11, and are arranged with a space in the first direction X. The lower electrodes E11 and E12 each are an electrode arranged for each sub-pixel or each display element, and each are electrically connected to the drive transistor 3. These lower electrodes E11 and E12 each may be referred to as a pixel electrode, an anode or the like.

The lower electrodes E11 and E12 each are a transparent electrode formed of a transparent conductive material such as indium tin oxide (ITO) or indium zinc oxide (IZO), for example. Note that the lower electrodes E11 and E12 each may be a metal electrode formed of a metal material such as silver or aluminum. In addition, the lower electrodes E11 and E12 each may be a stack of a transparent electrode and a metal electrode. For example, the lower electrodes E11 and E12 each may be composed as a stack of layers stacked in the order of a transparent electrode, a metal electrode and a transparent electrode or may be composed as a stack of three or more layers. The insulating layer 12 is arranged between the lower electrode E11 and the lower electrode E12. In addition, the insulating layer 12 has the opening OP1, the opening OP2, sloping surfaces S1 and S2, and the upper surface U1.

The opening OP1 is formed in an area overlapping the lower electrode E11, and is a through hole penetrating the insulating layer 12 to the lower electrode E11. A peripheral portion of the lower electrode E11 is covered with the insulating layer 12, and a central portion of the lower electrode E11 is exposed from the insulating layer 12 in the opening OP1.

The opening OP2 is formed in an area overlapping the lower electrode E12, and is a through hole penetrating the insulating layer 12 to the lower electrode E12. A peripheral portion of the lower electrode E12 is covered with the insulating layer 12, and a central portion of the lower electrode E12 is exposed from the insulating layer 12 in the opening OP2.

The upper surface U1 and the sloping surfaces S1 and S2 correspond to a surface of the insulating layer 12 between the opening OP1 and the opening OP2. The sloping surface S1 faces the opening OP1. The sloping surface S2 faces the opening OP2. The upper surface U1 is located between the sloping surfaces S1 and S2. Note that the upper surface U1 and the sloping surfaces S1 and S2 each are, for example, a flat surface but each may be a curved surface.

The organic layer OR1 includes a light emitting layer EL1. The organic layer OR1 is arranged in the opening OP1 and covers the lower electrode E11. In the example shown in FIG. 3, the organic layer OR1 is arranged on the sloping surface S1 and is also arranged on a part of the upper surface U1, but is separated from the feed line FL.

The organic layer OR2 includes a light emitting layer EL2. The light emitting layer EL2 may be formed of the same material as the light emitting layer EL1 (the emission colors of the organic layer OR1 and the organic layer OR2 are the same) or may be formed of a different material from the light emitting layer EL1 (the emission colors of the organic layer OR1 and the organic layer OR2 are different from each other).

The organic layer OR2 is arranged in the opening OP2 and covers the lower electrode E12. In the example shown in FIG. 3, the organic layer OR2 is arranged on the sloping surface S2 and is also arranged on a part of the upper surface U1, but is separated from the feed line FL. On the upper surface U1, the organic layer OR2 is separated from the organic layer OR1. The feed line FL is located between the organic layer OR1 and the organic layer OR2 on the upper surface U1.

The organic layers OR1 and OR2 each may further include various function layers. The function layers are, for example, a hole injection layer, a hole transport layer, a hole blocking layer, an electron injection layer, an electron transport layer and an electron blocking layer, but may be other function layers.

The upper electrode E21 is stacked on the organic layer OR1, and covers the entire organic layer OR1 including a peripheral portion of the organic layer OR1. In addition, the upper electrode E21 is in contact with the feed line FL on the upper surface U1. A part of the organic layer OR1 located between the lower electrode E11 and the upper electrode E21 without via the insulating layer 12 can form a light emitting area of the display element 21. A part of the organic layer OR1 arranged on the sloping surface S1 and the upper surface U1 is located between the insulating layer 12 and the upper electrode E21, and therefore hardly emits light.

The upper electrode E22 is stacked on the organic layer OR2, and covers the entire organic layer OR2 including a peripheral portion of the organic layer OR2. In addition, the upper electrode E22 is in contact with the feed line FL on the upper surface U1. The upper electrode E22 is separated from the upper electrode E21. A part of the organic layer OR2 located between the lower electrode E12 and the upper electrode E22 without via the insulating layer 12 can form a light emitting area of the display element 22. A part of the organic layer OR2 arranged on the sloping surface S2 and the upper surface U1 is located between the insulating layer 12 and the upper electrode E22, and therefore hardly emits light.

These upper electrodes E21 and E22 each are an electrode arranged for each sub-pixel or each display element, but are in contact with the feed line FL, and are therefore electrically connected to each other. These upper electrodes E21 and E22 each may be referred to as a common electrode, a counter electrode, a cathode or the like.

The upper electrodes E21 and E22 each are a transflective metal electrode formed of a metal material such as magnesium or silver, for example. Note that the upper electrodes E21 and E22 each may be a transparent electrode formed of a transparent conductive material such as ITO or IZO. In addition, the upper electrodes E21 and E22 each may be a stack of a transparent electrode and a metal electrode.

The partition 30 is located between the display element 21 and the display element 22, and is arranged on the insulating layer 12. In the example shown in FIG. 3, the partition 30 is arranged on the feed line FL. More specifically, the partition 30 has a first layer 31 and a second layer 32.

The first layer 31 is in contact with the feed line FL, and is arranged between the organic layer OR1 and the organic layer OR2 and between the upper electrode E21 and the upper electrode E22. The first layer 31 has a side surface S11 facing the opening OP1, a side surface S12 facing the opening OP2, and an upper surface U11 between the side surface S11 and the side surface S12. The first layer 31 exposes an area of the feed line FL which faces the opening OP1 and an area of the feed line FL which faces the opening OP2. That is, the feed line FL extends between the side surface S11 and the organic layer OR1, and is in contact with the upper electrode E21. In addition, the feed line FL extends between the side surface S12 and the organic layer OR2, and is in contact with the upper electrode E22. This first layer 31 may be a conductor or an insulator.

The second layer 32 is in contact with the upper surface U11. The second layer 32 protrudes from the side surface S11 toward the opening OP1, and also protrudes from the side surface S12 toward the opening OP2. The second layer 32 may be a conductor or an insulator. In addition, the second layer 32 may be formed of a different material from the first layer 31 or may be formed of the same material as the first layer 31.

This partition 30 is in the form of a lattice in planar view, and overlaps the lattice-like feed lines FL shown in FIG. 2.

An organic layer (third organic layer) OR3 covers an upper surface U21 of the second layer 32. The organic layer OR3 is covered with an upper electrode (third upper electrode) E23. The organic layer OR3 is formed of the same material as the organic layers OR1 and OR2, but is separated from the organic layers OR1 and OR2. In addition, the upper electrode E23 is formed of the same material as the upper electrodes E21 and E22, but is separated from the upper electrodes E21 and E22.

Figure 4:
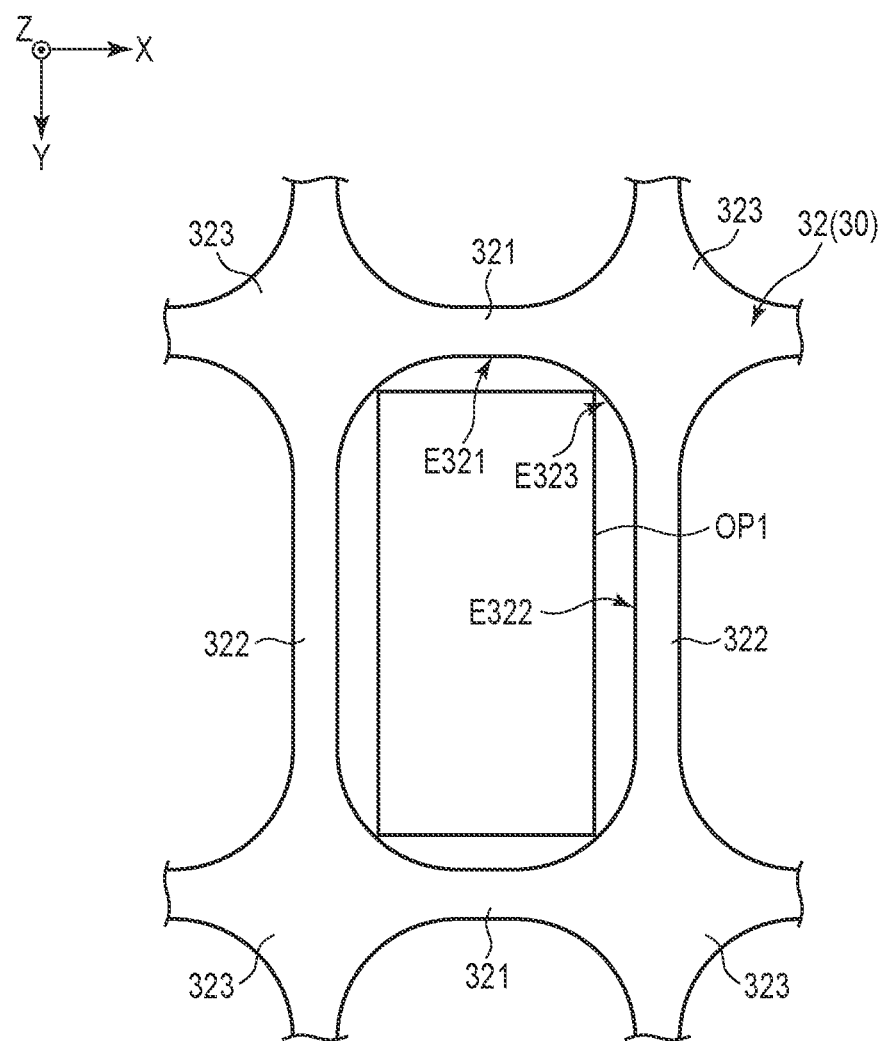
FIG. 4 is a plan view showing an example of a second layer 32 constituting a partition 30 shown in FIG. 3.

FIG. 4 is a plan view showing an example of the second layer 32 constituting the partition 30 shown in FIG. 3.

The second layer 32 has first parts 321, second parts 322 and third parts 323. The first parts 321, the second parts 322 and the third parts 323 are integrally or continuously formed.

The first parts 321 extend in the first direction X. One pair of first parts 321 are arranged to be opposed to each other across the opening OP1.

The second parts 322 extend in the second direction Y. One pair of second parts 322 are arranged to be opposed to each other across the opening OP1.

The third parts 323 are continuous with the first parts 321 and the second parts 322. Four third parts 323 are arranged to be opposed to four corners of the opening OP1.

In addition, the third part 323 has an arc-shaped edge E323 facing the opening OP1. The edge E323 is closer to the opening OP1 than an edge E321 facing the opening OP1 of the first part 321 and an edge E322 facing the opening OP1 of the second part 322. In the example shown in FIG. 4, the edge E321, the edge E322 and the edge E323 do not overlap the opening OP1 in planar view. In some cases, the edge E323 may overlap the opening OP1 in planar view.

Figure 5:
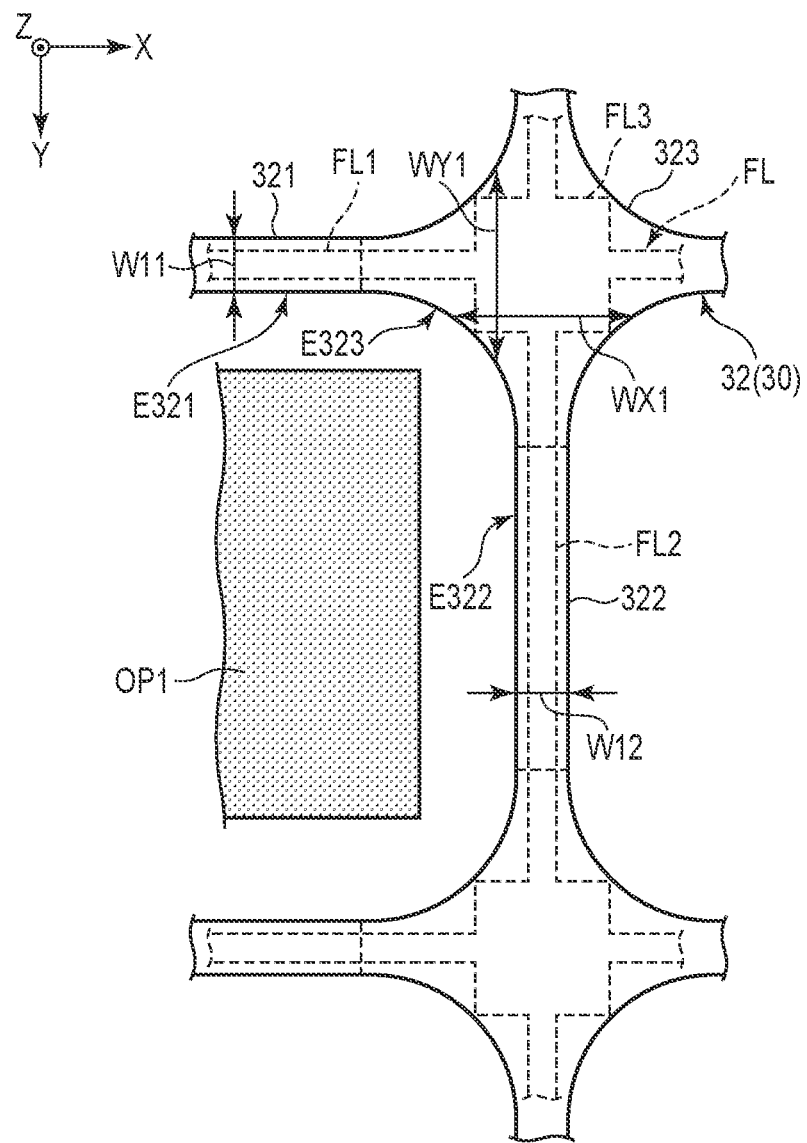
FIG. 5 is a plan view showing an example of the partition 30 overlapping a feed line FL shown in FIG. 2.

FIG. 5 is a plan view showing an example of the partition 30 shown in FIG. 3. Here, the outer shape of the second layer 32 of the partition 30 is illustrated, and the feed line FL is shown by a dotted line.

In planar view, the first part 321 overlaps the first line portion FL1, the second part 322 overlaps the second line portion FL2, and the third part 323 overlaps the third line portion FL3.

The first part 321 has a substantially constant width W11 along the second direction Y. In one example, the first part 321 is wider than the first line portion FL1. That is, the width along the second direction Y of the first part 321 is greater than the width along the second direction Y of the first line portion FL1. Note that the first part 321 may have an equal width to the first line portion FL1 or the first part 321 may be thinner than the first line portion FL1.

The second part 322 has a substantially constant width W12 along the first direction X. In one example, the second part 322 is wider than the second line portion FL2. That is, the width along the first direction X of the second part 322 is greater than the width along the first direction X of the second line portion FL2. Note that the second part 322 may have an equal width to the second line portion FL2 or the second part 322 may be thinner than the second line portion FL2.

The third part 323 has a width WX1 along the first direction X and a width WY1 along the second direction Y. The width WY1 is greater than the width W11 (WY1>W11). The width WX1 is greater than the width W12 (WX1>W12).

In the third part 323 shaped like this, the widths WX1 and WY1 continuously change. For example, the width WX1 is equal to the width W12 at a position close to the second part 322, and gradually increases as the distance from the second part 322 increases. Similarly, the width WY1 is equal to the width W11 at a position close to the first part 321, and gradually increases as the distance form the first part 321 increases.

Next, a method for manufacturing the display elements 21 and 22 having the above structure will be briefly described.

For example, after the lower electrodes E11 and E12 are formed, an organic insulating layer is formed and this organic insulating layer is patterned to form the insulating layer 12. After that, at least one of a metal layer and an insulating layer is formed and patterned to form the partition 30.

After that, the respective layers constituting the organic layer OR are formed by, for example, a vacuum vapor deposition method. At this time, the organic layers OR1 and OR2 are formed in the openings OP1 and OP2, respectively, and the organic layer OR3 is formed on the partition 30. That is, the organic layers OR1 and OR2 which are separated from each other are formed without using a fine mask.

After that, the upper electrode E2 is formed by, for example, a sputtering method. At this time, the upper electrodes E21 and E22 are formed in the openings OP1 and OP2, respectively, and the upper electrode E23 is formed on the partition 30. That is, the upper electrodes E21 and E22 which are separated from each other are formed without using a fine mask.

The emission angle of a material for the upper electrode E2 is greater than the emission angle of a material for the organic layer OR. Therefore, the material for the organic layer OR hardly reaches below the second layer 32 of the partition 30 and exposes the feed line FL. On the other hand, the material for the upper electrode E2 comes around to an area behind the second layer 32 of the partition 30. Accordingly, the upper electrodes E21 and E22 which each are in contact with each of the first line portion FL1, the second line portion FL2 and the third line portion FL3 of the feed line FL are formed.

As described above, the partition 30 is arranged between the adjacent display elements 20, and the organic layer OR formed without via a fine mask is divided by the partition 30. Therefore, the display element 20 comprising the organic layer OR having a desired shape is provided. Therefore, as compared with when a fine mask is applied, the manufacturing cost can be reduced, and since a process such as positioning of a fine mask is not required, and the organic layer OR having a desired shape can be easily formed. In addition, in the display element 20, the light emitting area can be formed in a predetermined area, and undesired light emission in an area overlapping the insulating layer 12 is also suppressed.

In addition, the upper electrode E2 is divided by the partition 30 in the same manner as the organic layer OR, but each upper electrode E2 is in contact with the feed line FL located below the partition 30. Furthermore, with respect to the feed line FL arranged to surround the upper electrode E2, substantially the entire peripheral portion of the upper electrode E2 is in contact with the feed line FL (the first line portion FL1, the second line portion FL2 and the third line portion FL3). Therefore, the contact area of the upper electrode E2 and the feed line FL can be sufficiently secured, and a predetermined potential can be supplied to the entire surface of the upper electrode E2.

Figure 6:
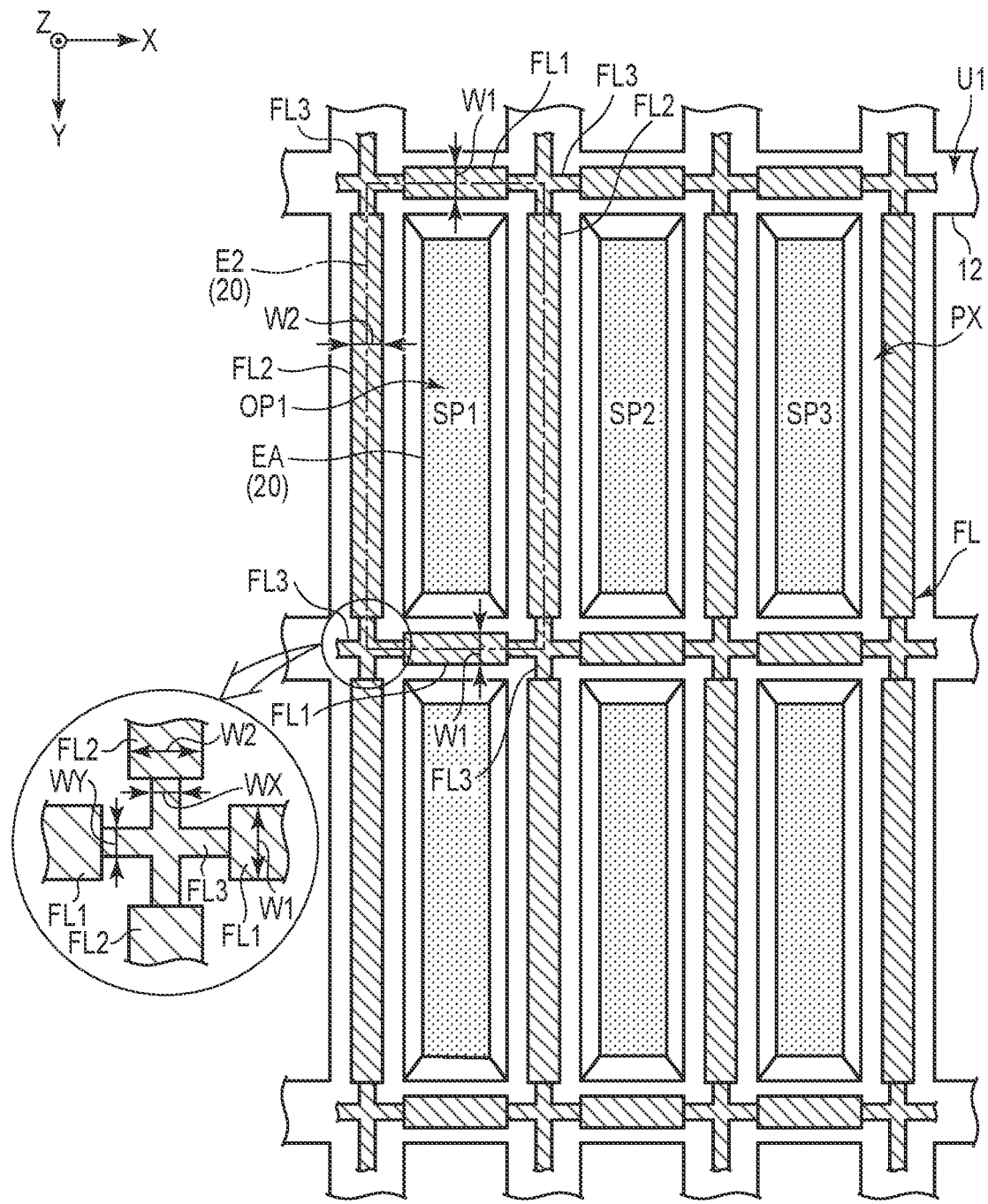
FIG. 6 is a plan view showing another example of the pixel PX shown in FIG. 1.

FIG. 6 is a plan view showing another example of the pixel PX shown in FIG. 1.

The example shown in FIG. 6 is different from the example shown in FIG. 2 in the shape of the third line portion FL3. That is, the feed lines FL have the first line portions FL1, the second line portions FL2 and the third line portions FL3 which are integrally or continuously formed. The first line portions FL1 and the second line portions FL2 are configured in the same manner as the example shown in FIG. 2.

The third line portions FL3 are continuous with the first line portions FL1 and the second line portions FL2. In the example shown in FIG. 6, the third line portion FL3 is substantially in the form of a cross having the width WX along the first direction X and the width WY along the second direction Y. The width WY is less than the width W1 of the first line portion FL1 (WY<W1). The width WX is less than the width W2 of the second line portion FL2 (WX<W2).

The upper electrode E2 of the display element 20 overlaps not only the light emitting area EA but also the insulating layer 12 between the light emitting area EA and the feed line FL as shown by a dashed dotted line. In addition, the upper electrode E2 is in contact with each of the first line portion FL1, the second line portion FL2 and the third line portion FL3. Accordingly, a predetermined potential is supplied from the feed line FL to the upper electrode E2.

Figure 7:
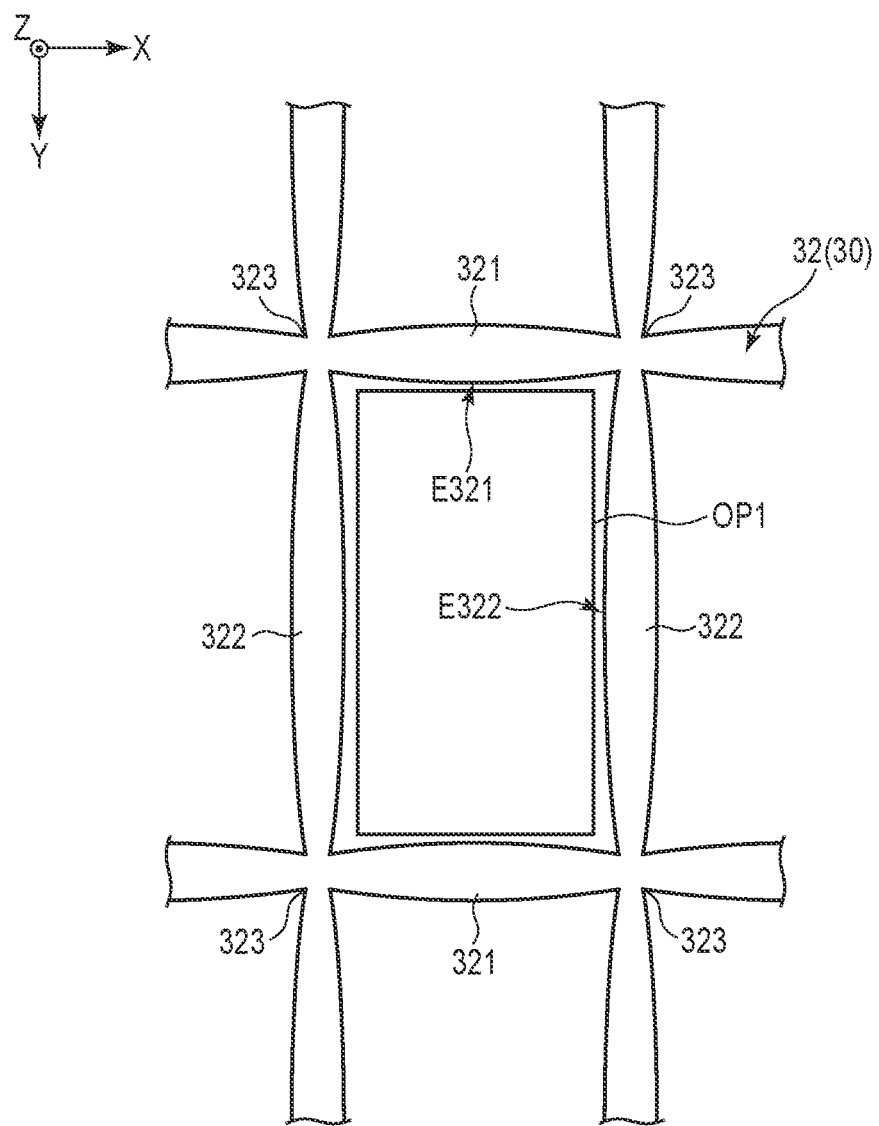
FIG. 7 is a plan view showing another example of the second layer 32 constituting the partition 30.

FIG. 7 is a plan view showing another example of the second layer 32 constituting the partition 30.

The second layer 32 has the first parts 321, the second parts 322 and the third parts 323. The first parts 321, the second parts 322 and the third parts 323 are integrally or continuously formed. The edge E321 of the first part 321 and the edge E322 of the second part 322 each are in the form of a bow convex toward the opening OP1. The edge E321 and the edge E322 are connected to each other in the third part 323. The edge E321 and the edge E322 do not overlap the opening OP1 in planar view.

The planar shape of the second layer 32 surrounding each of another opening adjacent to the opening OP1 in the first direction X, another opening adjacent to the opening OP1 in the second direction Y, and another opening adjacent to the opening OP1 in an oblique direction (diagonal direction) is the same as the planar shape of the second layer 32 surrounding the opening OP1.

Figure 8:
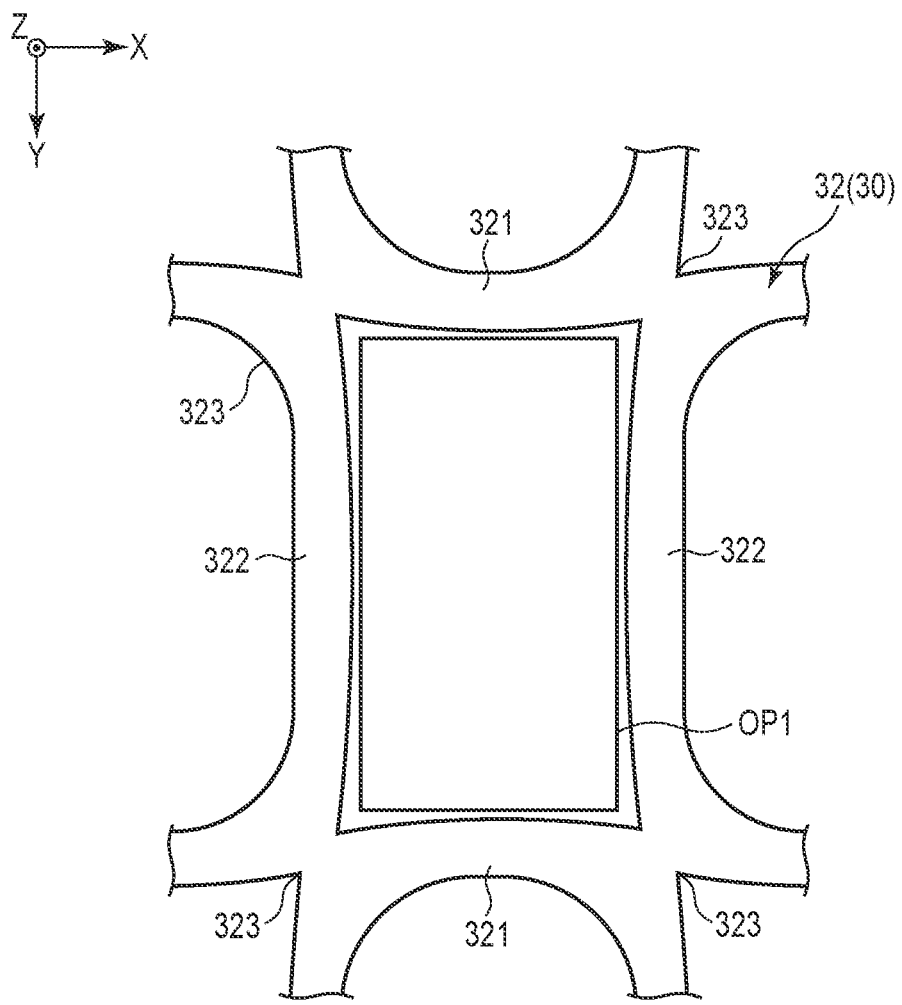
FIG. 8 is a plan view showing another example of the second layer 32 constituting the partition 30.

FIG. 8 is a plan view showing another example of the second layer 32 constituting the partition 30. The example shown in FIG. 8 corresponds to the combination of the example shown in FIG. 4 and the example shown in FIG. 7.

That is, the planar shape of the second layer 32 surrounding each of another opening adjacent to the opening OP1 in the first direction X and another opening adjacent to the opening OP1 in the second direction Y is same as the planar shape of the second layer 32 surrounding the opening OP1 shown in FIG. 4.

In addition, the planar shape of the second layer 32 surrounding each of another opening adjacent to the opening OP1 in an oblique direction (diagonal direction) is the same as the planar shape of the second layer 32 surrounding the opening OP1 shown in FIG. 7.

Figure 9:
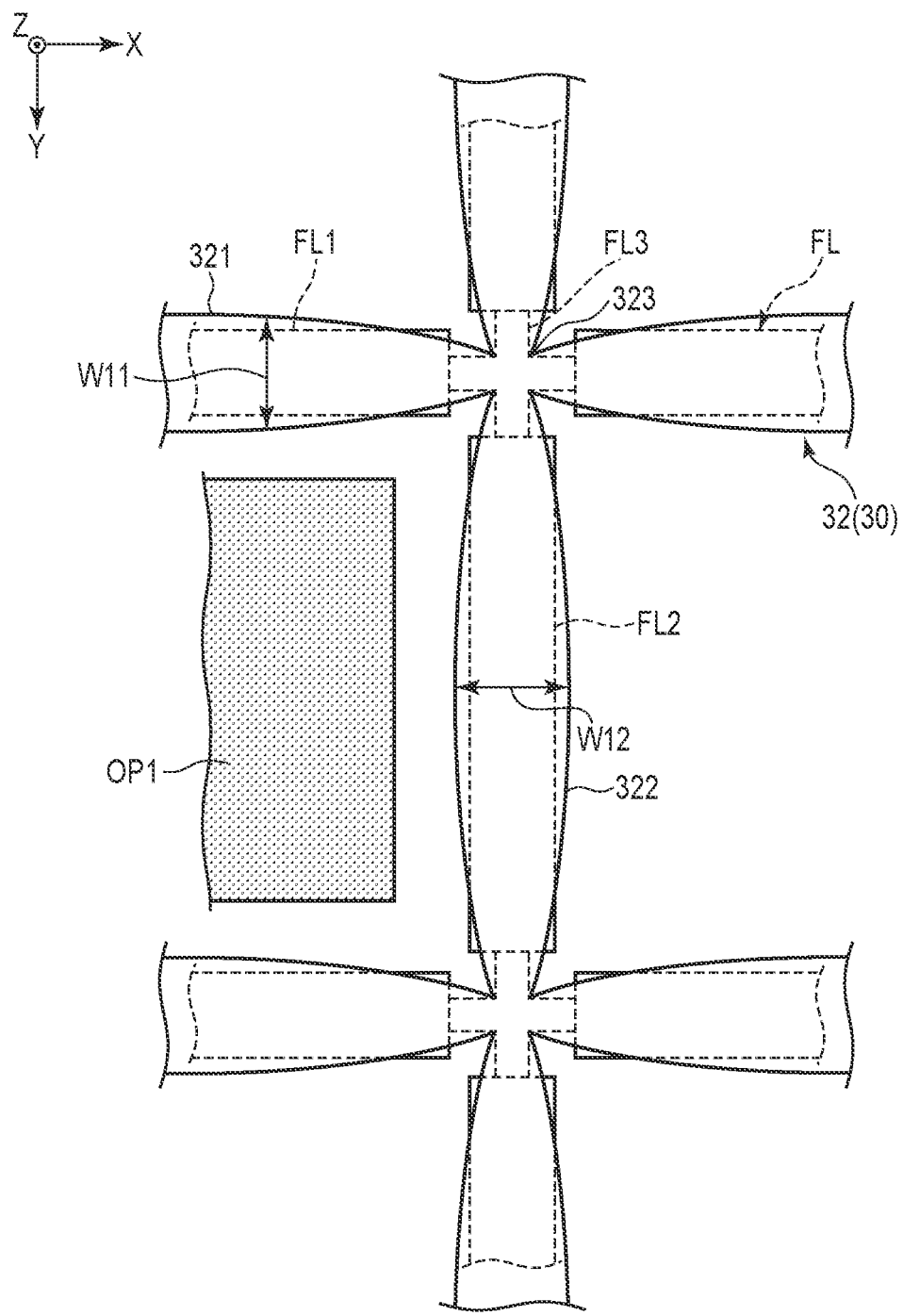
FIG. 9 is a plan view showing an example of the partition 30 overlapping the feed line FL shown in FIG. 6.

FIG. 9 is a plan view showing an example of the partition 30 overlapping the feed line FL shown in FIG. 6. Here, the outer shape of the second layer 32 shown in FIG. 7 of the partition 30 is illustrated, and the feed line FL is shown by a dotted line.

In planar view, the first part 321 overlaps the first line portion FL1, the second part 322 overlaps the second line portion FL2, and the third part 323 overlaps the third line portion FL3.

The first part 321 extends in the first direction X, and has the width W11 along the second direction Y. The width W11 changes continuously, for example, and gradually decreases as the distance to the third part 323 decreases. The width W11 becomes minimum at the part where the first part 321 and the third part 323 are connected to each other.

The second part 322 extends in the second direction Y, and has the width W12 along the first direction X. The width W12 changes continuously, for example, and gradually decreases as the distance to the third part 323 decreases. The width W12 becomes minimum at the part where the second part 322 and the third part 323 are connected to each other.

Also in other examples like these, the same effects as those described above can be obtained.

According to the present embodiment described above, the display device capable of supplying a predetermined potential to the upper electrode of the display element can be provided.

All display devices, which are implementable by a person of ordinary skill in the art through proper design changes to the display device described above as the embodiment of the present invention, come within the scope of the present invention as long as they are in keeping with the spirit of the present invention.

Various modifications are easily conceivable within the category of the idea of the present invention by a person of ordinary skill in the art, and these modifications are also considered to fall within the scope of the present invention. For example, additions, deletions or changes in design of the constituent elements or additions, omissions or changes in condition of the processes may be properly made to the above embodiment by a person of ordinary skill in the art, and these modifications also fall within the scope of the present invention as long as they encompass the spirit of the present invention.

Furthermore, the other advantages of the aspects described in the embodiment, which are obvious from the description of the specification or which are properly conceivable by a person of ordinary skill in the art, are considered to be achievable by the present invention as a matter of course.

What is claimed is:

1. A display device comprising:
   an insulating substrate;
   a first insulating layer arranged on the insulating substrate;
   a lower electrode arranged on the first insulating layer;
   a second insulating layer arranged on the first insulating layer, comprising an opening overlapping the lower electrode, and being in a form of a lattice;
   a feed line arranged on the second insulating layer, comprising a first line portion extending in a first direction, a second line portion extending in a second direction intersecting the first direction, and a third line portion being continuous with each of the first line portion and the second line portion and having a width different from a width of the first line portion and a width of the second line portion;

an organic layer including a light emitting layer, arranged in the opening, and covering the lower electrode;

an upper electrode in contact with each of the first line portion, the second line portion, and the third line portion, and covering the organic layer; and a partition arranged on the feed line, wherein the partition comprises a first layer comprising a side surface facing the opening, and a second layer overlapping the first layer and protruding from the side surface toward the opening, the second layer is in a form of a lattice comprising a first part extending in the first direction and overlapping the first line portion, a second part extending in the second direction and overlapping the second line portion, and a third part continuous with the first part and the second part and overlapping the third line portion in planar view, a width along the second direction of the third part is greater than a width along the second direction of the first part, a width along the first direction of the third part is greater than a width along the first direction of the second part, the third part includes an arc-shaped edge facing the opening, a width along the second direction of the third line portion is less than or equal to the width along the second direction of the third part, and a width along the first direction of the third line portion is less than or equal to the width along the first direction of the third part.

2. The display device of claim 1, wherein the width along the second direction of the third line portion is greater than a width along the second direction of the first line portion, and the width along the first direction of the third line portion is greater than a width along the first direction of the second line portion.

3. The display device of claim 2, wherein the third line portion is substantially in a form of a quadrangle.

4. The display device of claim 1, wherein the width along the second direction of the first part is greater than a width along the second direction of the first line portion, and the width along the first direction of the second part is greater than a width along the first direction of the second line portion.

5. The display device of claim 4, wherein the edge does not overlap the opening in planar view.

* * * * *